(12) United States Patent
Deak et al.

(10) Patent No.: US 8,933,523 B2
(45) Date of Patent: Jan. 13, 2015

(54) SINGLE-CHIP REFERENCED FULL-BRIDGE MAGNETIC FIELD SENSOR

(76) Inventors: James G. Deak, Zhangjiagang (CN); Insik Jin, Zhangjiagang (CN); Weifeng Shen, Zhangjiagang (CN); Songsheng Xue, Zhangjiagang (CN); Xiaofeng Lei, Zhangjiagang (CN)

( * ) Notice: Subject to any disclaimer, the term of this patent is extended or adjusted under 35 U.S.C. 154(b) by 0 days.

(21) Appl. No.: 14/112,928

(22) PCT Filed: Apr. 6, 2012

(86) PCT No.: PCT/CN2012/073604
§ 371 (c)(1),
(2), (4) Date: Oct. 19, 2013

(87) PCT Pub. No.: WO2012/142915
PCT Pub. Date: Oct. 26, 2012

(65) Prior Publication Data
US 2014/0054733 A1 Feb. 27, 2014

(30) Foreign Application Priority Data
Apr. 21, 2011 (CN) .......................... 2011 1 0100226

(51) Int. Cl.
*H01L 27/22* (2006.01)
*H01L 43/02* (2006.01)
*G01R 33/09* (2006.01)
(52) U.S. Cl.
CPC .............. *H01L 43/02* (2013.01); *G01R 33/098* (2013.01)
USPC ........................................................ 257/427

(58) Field of Classification Search
CPC ...... H01L 27/22; H01L 43/065; G01D 5/145; E21B 47/102
USPC ................................ 257/427; 324/207.21, 324
See application file for complete search history.

(56) References Cited

U.S. PATENT DOCUMENTS 7,639,005 B2 * 12/2009 Qian et al. ..................... 324/252
7,642,773 B2 * 1/2010 Takahashi et al. ........ 324/207.21

FOREIGN PATENT DOCUMENTS

CN 1320216 A * 10/2001
CN 1479874 A * 3/2004

* cited by examiner

*Primary Examiner* — Fernando L Toledo
*Assistant Examiner* — Neil Prasad
(74) *Attorney, Agent, or Firm* — Yuqin Jin

(57) ABSTRACT

The present invention discloses a single-chip referenced full-bridge magnetoresistive magnetic-field sensor. The single-chip sensor is a Wheatstone bridge arrangement of magnetoresistive sensing elements and reference elements. The sensing elements and reference elements are formed from either magnetic tunnel junctions or giant magnetoresistive materials. The sensitivity of the reference and sensor elements is controlled through one or a combination of magnetic bias, exchange bias, shielding, or shape anisotropy. Moreover, the bridge output is tuned by setting the ratio of the reference and sensor arm resistance values to a predetermined ratio that optimizes the bridge output for offset and symmetry. The single-chip referenced-bridge magnetic field sensor of the present invention exhibits excellent temperature stability, low offset voltage, and excellent voltage symmetry.

21 Claims, 12 Drawing Sheets

SINGLE-CHIP REFERENCED FULL-BRIDGE MAGNETIC FIELD SENSOR

CROSS-REFERENCE TO A RELATED APPLICATION

This application is a 35 U.S.C. §371 national phase application of PCT/CN2012/073604, filed on Apr. 6, 2012, which claims priority to a Chinese Patent Application No. CN201110100226.5, filed on Apr. 21, 2011, incorporated herein by reference in its entirety.

FIELD OF THE INVENTION

The invention relates to the general field of magnetic field detection with particular reference to methods for fabricating low-cost high-performance single-chip bridge sensors.

BACKGROUND ART

Magnetic sensors are widely used in modern systems to measure or detect physical parameters including but not limited to magnetic field strength, current, position, motion, orientation, and so forth. There are many different types of sensors in the prior art for measuring magnetic field and other parameters. However, they all suffer from various limitations well known in the art, for example, excessive size, inadequate sensitivity and/or dynamic range, cost, reliability and other factors. Thus, there continues to be a need for improved magnetic sensors, especially sensors that can be easily integrated with semiconductor devices and integrated circuits and manufacturing methods thereof.

Magnetic tunnel junction (MTJ) sensors have the advantages of high sensitivity, small size, low cost, and low power consumption. Although MTJ devices are compatible with standard semiconductor fabrication processes, methods for building high sensitivity devices with sufficient yield for low cost mass production have not been adequately developed. In particular, yield issues due to offset in the magnetoresistive response of MTJ sensors, and difficulty in matching the magnetoresistive response of MTJ elements when combined to form bridge sensors have proven difficult.

SUMMARY OF THE INVENTION

The purpose of the present invention is to provide a single-chip referenced full-bridge magnetic field sensor, wherein the linear response of the sensor is optimized by controlling the bias field and angle of the permanent magnets.

To achieve the above object, the present invention is to provide a single-chip referenced full-bridge magnetic field sensor comprising two reference arms and two sensing arms that are spatially interleaved and electrically interconnected to form a Wheatstone bridge, wherein each reference arm includes one or more MTJ or GMR magnetoresistive reference elements, and each sensing arm includes one or more MTJ or GMR magnetoresistive sensing elements, said sensing elements utilize the portion of the transfer curve that is linearly dependent on the applied magnetic field: the magnetic field sensor further comprises a set of permanent magnets located in the vicinity of the sensing and reference elements, wherein the orientation of the permanent magnet structures and the permanent magnet magnetization is used to adjust the response of the sensor chip, and a set of bond pads used to electrically connect said referenced full-bridge sensor chip to an ASIC or to the lead frame of a semiconductor package.

The present invention also provides a single-chip referenced full-bridge magnetic field sensor comprising two reference arms and the two sensing arms that are spatially interleaved and electrically interconnected to form a Wheatstone bridge, wherein each reference arm includes one or more MTJ or GMR magnetoresistive reference elements, and each sensing arm includes one or more MTJ or GMR magnetoresistive sensing elements, said sensing elements utilize the portion of the transfer curve that is linearly dependent on the applied magnetic field; wherein the MTJ or GMR magnetoresistive reference elements are thinner and longer than the MTJ or GMR magnetoresistive sensing elements; and a set of bond pads used to electrically connect said referenced full-bridge sensor chip to an ASIC or to the lead frame of a semiconductor package.

The present invention also provides a single-chip referenced full-bridge magnetic field sensor comprising two reference arms and the two sensing arms that are spatially interleaved and electrically interconnected to form a Wheatstone bridge, wherein each reference arm includes one or more MTJ or GMR magnetoresistive reference elements, and each sensing arm includes one or more MTJ or GMR magnetoresistive sensing elements, said sensing elements utilize the portion of the transfer curve that is linearly dependent on the applied magnetic field; wherein the reference arm is covered by a magnetic shield composed of a high permeability ferromagnetic material; and a set of bond pads used to electrically connect said referenced full-bridge sensor chip to an ASIC or to the lead frame of a semiconductor package.

The present invention also provides a single-chip referenced full-bridge magnetic field sensor comprising two reference arms and the two sensing arms that are spatially interleaved and electrically interconnected to form a Wheatstone bridge, wherein each reference arm includes one or more MTJ or GMR magnetoresistive reference elements, and each sensing arm includes one or more MTJ or GMR magnetoresistive sensing elements, said sensing elements utilize the portion of the transfer curve that is linearly dependent on the applied magnetic field; an antiferromagnetic layer or a permanent magnet layer deposited above or below a free layer of the reference arms, wherein an exchange coupling from the antiferromagnetic layer or stray field coupling from the permanent magnet layer is used to magnetically bias the reference arm; and a set of bond pads used to electrically connect said referenced full-bridge sensor chip to an ASIC or to the lead frame of a semiconductor package.

The present invention also provides a single-chip referenced full-bridge magnetic field sensor comprising two reference arms and the two sensing arms that are spatially interleaved and electrically interconnected to form a Wheatstone bridge, wherein each reference arm includes one or more MTJ or GMR magnetoresistive reference elements, and each sensing arm includes one or more MTJ or GMR magnetoresistive sensing elements, said sensing elements utilize the portion of the transfer curve that is linearly dependent on the applied magnetic field; an antiferromagnetic layer or a permanent magnet layer deposited above or below a free layer of the reference arms, wherein an exchange coupling from the antiferromagnetic layer or stray field coupling from the permanent magnet layer is used to magnetically bias the reference arm; the MTJ or GMR magnetoresistive reference elements are thinner and longer than the MTJ or GMR magnetoresistive sensing elements; and a set of bond pads used to electrically connect said referenced full-bridge sensor chip to an ASIC or to the lead frame of a semiconductor package.

The present invention also provides a single-chip referenced full-bridge magnetic field sensor comprising two reference arms and the two sensing arms that are spatially interleaved and electrically interconnected to form a Wheatstone bridge, wherein each reference arm includes one or more MTJ or GMR magnetoresistive reference elements, and each sensing arm includes one or more MTJ or GMR magnetoresistive sensing elements, said sensing elements utilize the portion of the transfer curve that is linearly dependent on the applied magnetic field; an antiferromagnetic layer or a permanent magnet layer deposited above or below a free layer of the reference arms, wherein an exchange coupling from the antiferromagnetic layer or stray field coupling from the permanent magnet layer is used to magnetically bias the reference arm; wherein the reference arm is covered by a magnetic shield composed of a high permeability ferromagnetic material; and a set of bond pads used to electrically connect said referenced full-bridge sensor chip to an ASIC or to the lead frame of a semiconductor package.

By using the above mentioned techniques, the single-chip referenced magnetic field sensor bridge demonstrated excellent temperature stability, low offset voltage, and excellent voltage symmetry. This single-chip referenced magnetic field sensor bridge can be fabricated using standard semiconductor manufacturing processes.

DESCRIPTION OF THE PREFERRED EMBODIMENTS

Figure 1:
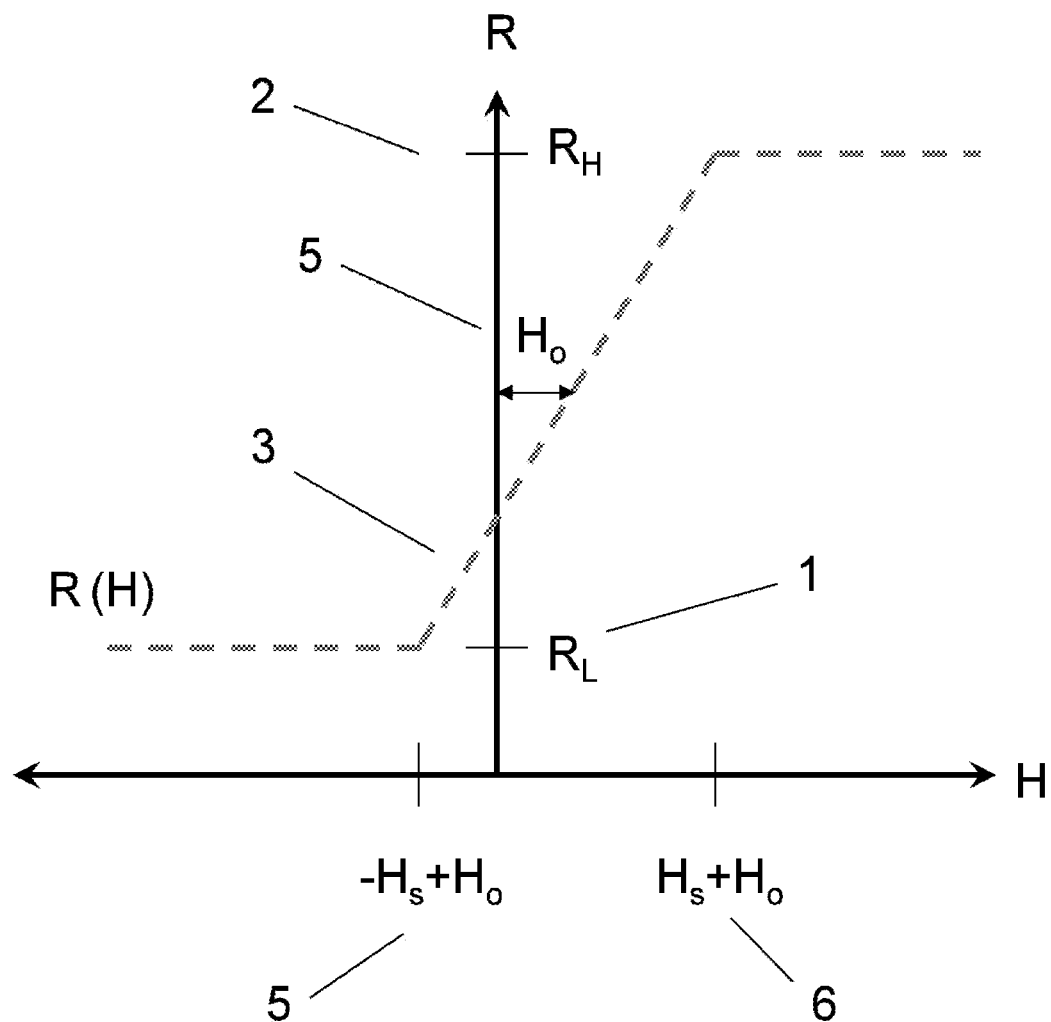
FIG. 1—Schematic drawing of the magnetoresistive response of a spin-valve sensing element with the reference layer magnetization pointing in the negative H direction.

The general form of the magnetoresistive transfer curve of a GMR or MTJ magnetic sensor element suitable for linear magnetic field measurement is shown schematically in FIG. 1. The transfer curves depicted in the figure saturates at low 1 and high 2 resistance values, $R_L$ and $R_H$, respectively. In the region between saturation, the transfer curve is linearly dependent on the applied magnetic field, H. The transfer curves need not be symmetric about the H=0 point in the plots. The saturation fields 5, 6 are typically offset by an amount $H_o$ such that the $R_L$ saturation region is closer to the H=0 point. The value of $H_o$, which is often referred to as "orange peel" or "Neel coupling," typically ranges from 1 to 25 Oe. It is a related to roughness of the ferromagnetic films within the GMR and MTJ structures, and it is dependent on materials and manufacturing processes.

Between 5 and 6, and for the purpose of illustrating device operation, the transfer curve in FIG. 1 may be approximated as:

$$R(H) = \frac{R_H - R_L}{2H_s}(H - H_o) + \frac{R_H + R_L}{2} \tag{1}$$

Figure 2:
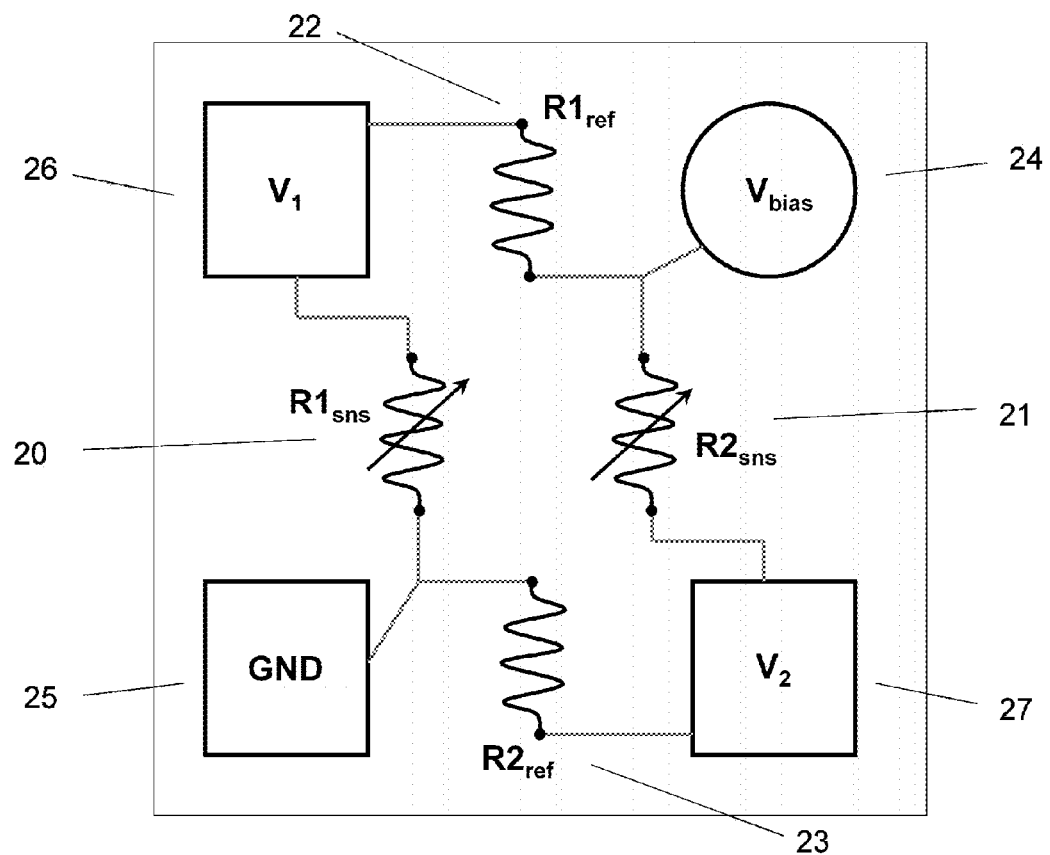
FIG. 2—Schematic drawing of a reference full-bridge sensor composed of magnetoresistive elements.

In order to form a referenced Wheatstone bridge, the sensor elements may be interconnected as shown in FIG. 2. Here, two sensor elements have a transfer curve that is strongly dependent on an applied magnetic field; these elements 20, 21 are referred to as the sensing arms. Two additional sensor elements, 22 and 23, have a transfer curve that is weakly dependent on an applied magnetic field. These elements 22, 23 are referred to as the reference arms. Additionally, when laid out on a substrate, the sensors need contact pads for voltage bias ($V_{bias}$, 24), ground (GND, 25), and two half bridge center-taps (V1, 26, V2, 27). The voltage at the center-taps is given as:

$$V1(H) = \frac{R1_{sns}(H)}{R1_{sns}(H) + R1_{ref}(H)} V_{bias} \tag{2}$$

$$V2(H) = \frac{R2_{ref}(H)}{R2_{sns}(H) + R2_{ref}(H)} V_{bias} \tag{3}$$

The output of the bridge sensor is defined as:

$$V(H) = V1(H) - V2(H) \tag{4}$$

Figure 3:
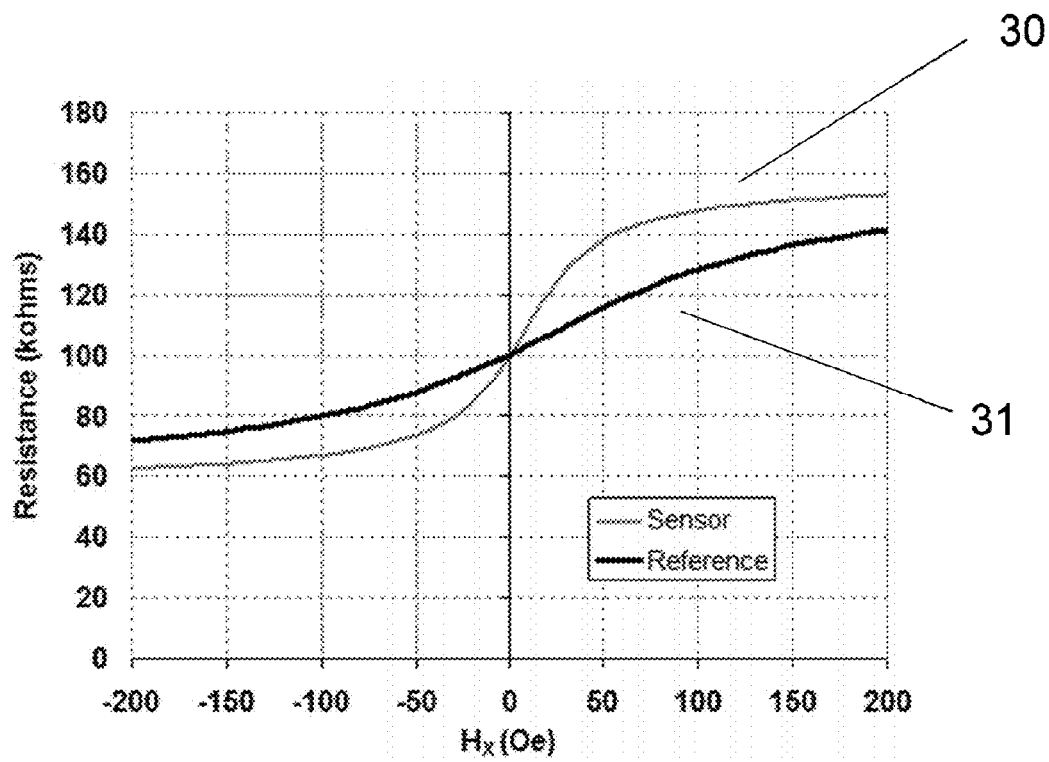
FIG. 3—Exemplary transfer curves of the reference and sensing arms of a referenced full bridge magnetoresistive sensor.
Figure 4:
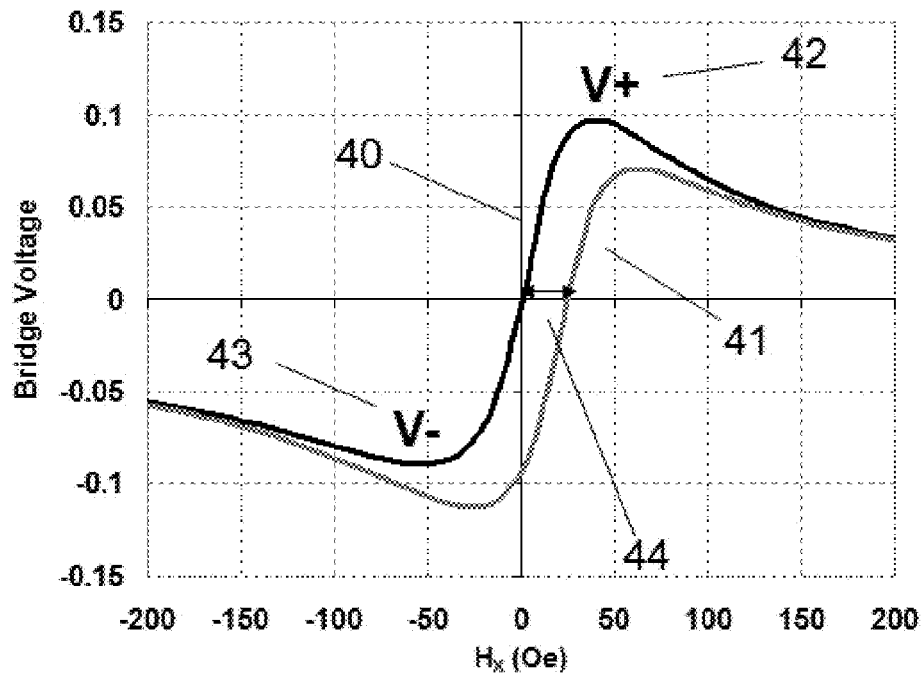
FIG. 4.—Exemplary transfer curve of a referenced full bridge magnetoresistive sensor.

Exemplary sensor and reference arm transfer curves, $R_{sns}$ (30) and $R_{ref}$ (31) are illustrated in FIGS. 3. Note $R_{ref}$ saturates at $H_s^{ref}$=130 Oe, and $R_{sns}$ saturates at $H_s^{sns}$=35 Oe. Note also the sensor and reference arm transfer curves are not centered about zero magnetic field, and they have offset ranging from $H_o^{sns}$=8 Oe for $R_{sns}$ to $H_o^{ref}$=25 Oe $R_{ref}$. In spite of the different offset values, the bridge transfer curve 40 is linear and well-centered as shown in FIG. 4.

For the ideal case where $R_L^{ref} \approx R_L^{snsf}$; $R_H^{ref} \approx R_H^{sns} = H_o^{ref} = H_o^{sns} \approx 0$, and at $H < H_s^{sns}$, the bridge response is $$V(H) = \frac{\frac{(H_s^{ref} - H_s^{sns})}{H_s^{ref} H_s^{sns}} H}{\frac{(H_s^{ref} + H_s^{sns})}{H_s^{ref} H_s^{sns}} H + 2 \frac{(R_H + R_L)}{(R_H - R_L)}} V_{bias} \quad (5)$$

The output is linear with H when $$\left| \frac{(H_s^{ref} + H_s^{sns})}{H_s^{ref} H_s^{sns}} H \right| \ll \left| 2 \frac{(R_H + R_L)}{(R_H - R_L)} \right| \quad (6)$$

Assuming "<<" represents an order of magnitude:

$$|H| < \sim \frac{1}{10} \left( 2 \frac{(R_H + R_L)}{(R_H - R_L)} \frac{H_s^{sns} H_s^{ref}}{(H_s^{sns} + H_s^{ref})} \right) \quad (7)$$

In practice, the linear region is sufficiently wide to produce a good linear sensor. For a sensor with magnetoresistance, DR/R≈150% and $H_s^{ref}$=130 Oe>>$H_s^{sns}$. The extent of the linear region of the sensor is thus on the order of $$|H_{Linear}| \leq 0.4 H_s^{sns} \quad (8)$$

Using these typical values, the device will operate as a linear sensor without correction provided $H_s^{sns}$ is approximately 2.5× larger than the desired extent of the linear operating range.

Referenced bridge sensors have some unique characteristics that become more apparent as the magnetoresistance of the sensor elements becomes large. FIG. 4 also shows a referenced bridge transfer curve at 41 that is offset along the field axis and asymmetric in voltage response. This non-ideal behavior is a characteristic of a referenced full-bridge sensor that must be accounted for when using magnetoresistive elements with large magnetoresistance ratios.

In order to better illustrate the factors that contribute to non-ideal response and disclose methods for optimizing the referenced bride response, it is necessary to define a metrics for bridge offset that is useful for quantifying voltage asymmetry. Bridge offset, (OFFSET) is simply read from the transfer curve at 44. Asymmetry (ASYM) can be defined using the V− (43) and V+ (42) values that correspond to maximum and minimum voltage values shown in FIG. 4:

$$ASYM = \frac{V_+ + V_-}{V_+ - V_-} * 100\% \quad (10)$$

Figure 5:
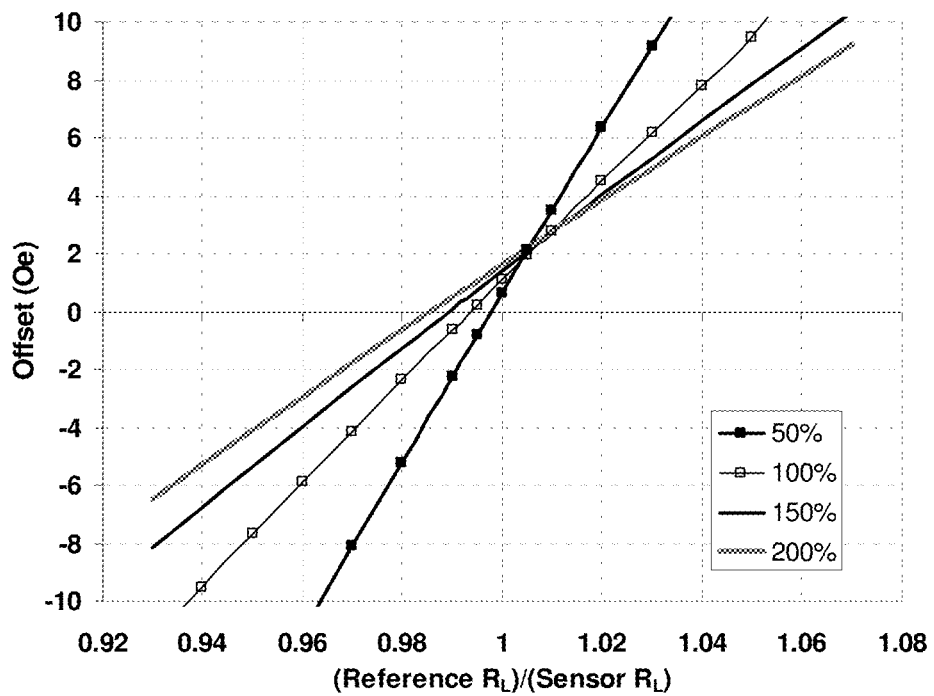
FIG. 5—Plots of bridge offset as a function of the resistance mismatch of the reference and sensor arms. Several different curves are plotted as a function of magnetoresistance ranging from 50% to 200%.

FIG. 5, shows OFFSET for a bridge sensor as a function of DR/R and the mismatch between reference and sensor leg resistance values, plotted for the ideal case where $H_o^{sns} = H_o^{ref} = 0$ Oe. In spite of the intrinsically centered transfer curves of the sensor and reference arms, the bridge output shows a change in offset that depends on magnetoresistance and resistance matching.

Figure 6:
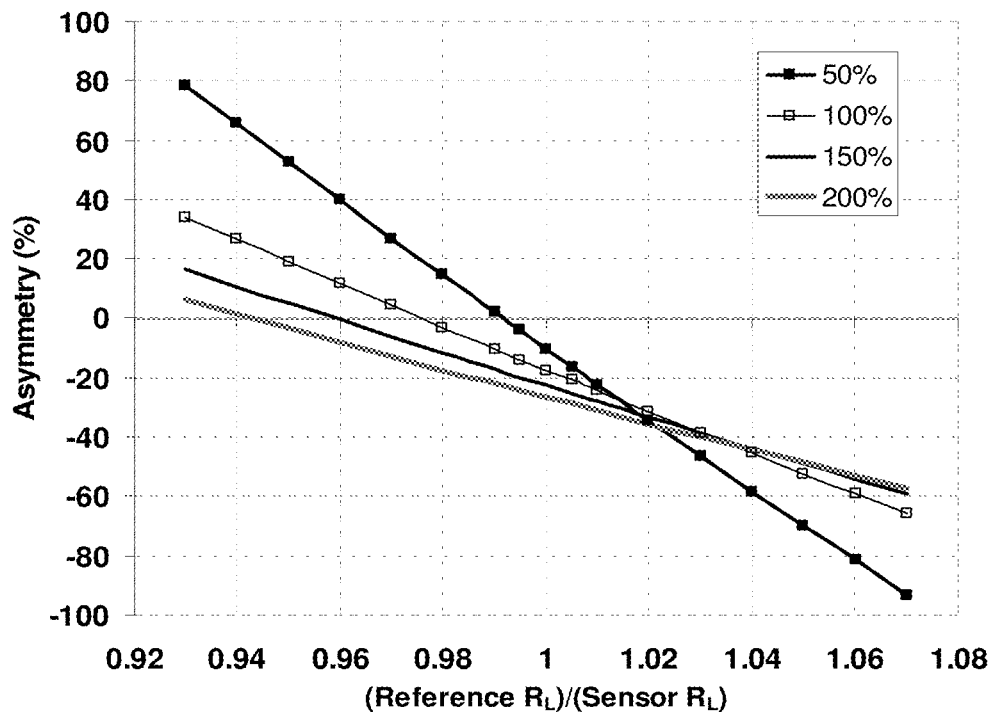
FIG. 6—Plots of bridge sensor transfer curve asymmetry as a function of the resistance mismatch of the reference and sensor arms. Several different curves are plotted as a function of magnetoresistance ranging from 50% to 200%.

FIG. 6 shows voltage asymmetry plotted for a bridge sensor under the same conditions. Again, in spite of the intrinsically centered transfer curves of the sensor and reference arms, the bridge output can be highly asymmetric when the reference and sensor arms are equally matched. Thus, minimization of the offset in the different bridge arms and matching the reference and sensor arm resistance values does not necessarily result in well centered, symmetric bridge response.

An ideal referenced bridge will have reference and sensor elements that saturate at different fields, the resistance will be set at a predetermined ratio that may not be 1, and offset fields may be applied to shift the response of the sensor arms with respect to the reference arms.

The first consideration in building a bridge sensor is the method used to set the relative sensitivity of the sensor and reference arms of the bridge. The sensitivity of the magnetoresistive elements is defined as the change in resistance as a function of applied magnetic field. This may be expressed as:

$$S_{MTJ} = \frac{\Delta R / R_L}{2 H_s} \quad (11)$$

It is not practical to change DR/R of the reference arm with respect to the sensor arm, so sensitivity is most easily adjusted by modifying $H_s$. This may be accomplished by one or a combination of several different techniques:

i. Shielding—Here, a high permeability ferromagnetic plate is deposited over top of the reference arms of the bridge in order to attenuate the applied magnetic field.

ii. Shape anisotropy stabilization—The reference and sensor MTJ elements have a different size and thus different shape anisotropy. The most general approach would be to make the reference MTJ elements longer and narrower than the sensor MTJ elements, such that the demagnetizing factor in the direction parallel to the sensing axis is much larger for the reference MTJ elements than it is for the sensing MTJ elements.

iii. Exchange bias—In this technique, an effective field is created in the direction perpendicular to the sensing axis, by exchange coupling the freelayer of the MTJ elements to an adjacent antiferromagnetic or permanent magnet layer. It may be desirable to put a thin spacer layer of a material like Cu or Ta between the freelayer and the layer to which it is exchange biased in order to reduce the strength of the exchange bias. Representative layering sequences are as follows:

a. . . . Seed/AF1/FM/Ru/FM/barrier/FM/spacer/AF2/cap . . .

b. . . . Seed/AF1/FM/Ru/FM/barrier/FM/spacer/PM/cap . . .

c. . . . Seed/AF1/FM/Ru/FM/barrier/FM/AF2/cap . . .

d. . . . Seed/AF 1/FM/Ru/FM/barrier/FM/PM/cap . . .

Here, AF1 and AF2 are antiferromagnetic materials, such as PtMn, IrMn, FeMn. FM is used to represent a ferromagnetic layer or multilayer comprised of many different possible ferromagnetic alloys, including but not limited to NiFe, CoFeB, CoFe, and NiFeCo. The barrier may be any insulating material that is compatible with spin polarized tunneling, such as $Al_2O_3$ or MgO. The spacer is generally a non magnetic layer, usually a thin layer of Ta, Ru or Cu. The different antiferromagnetic layers, AF1 and AF2 would generally be chosen such that the blocking temperature of AF2 is lower than the blocking temperature of AF1, so that the FM/Ru/FM pinning layer can be set in a direction orthogonal to the exchange bias fields created by FM2 on the freelayer.

iv. Magnetic field bias In this technique, permanent magnet materials, such as alloys of Fe, Co, Cr, and Pt are deposited on the sensor substrate or in the MTJ stack and used to produce a stray field that biases the MTJ element transfer curve. An advantage of permanent magnetic biasing is the permanent magnet can be initialized using a large magnetic field, after the bridge is fabricated. A further and very important advantage, is the bias field can be used to remove domains from the MTJ sensor elements in order to stabilize and linearize their response. These advantages provide great flexibility in tuning the design to account for manufacturing variation as will be discussed. For the in-stack design, the following schematic layering sequence is possible . . . Seed/AF1/FM/Ru/FM/barrier/FM/thick-spacer/PM/cap . . .

When using a cross-bias field to set the sensitivity of a MTJ element, the following relationship exists between the cross-bias field, $H_{cross}$, and $H_s$:

$$H_s \approx \frac{2K_s}{M_s} + H_{cross} \quad (12)$$

where $K_s$ is shape anisotropy of the freelayer, and $M_s$ is the saturation magnetization of the freelayer. Therefore, the sensitivity is inversely dependent on $H_{cross}$ as:

$$S_{MTJ} = \frac{\Delta R/R_L}{2\left(\frac{2K_s}{M_s} + H_{cross}\right)} \quad (13)$$

Figure 7:
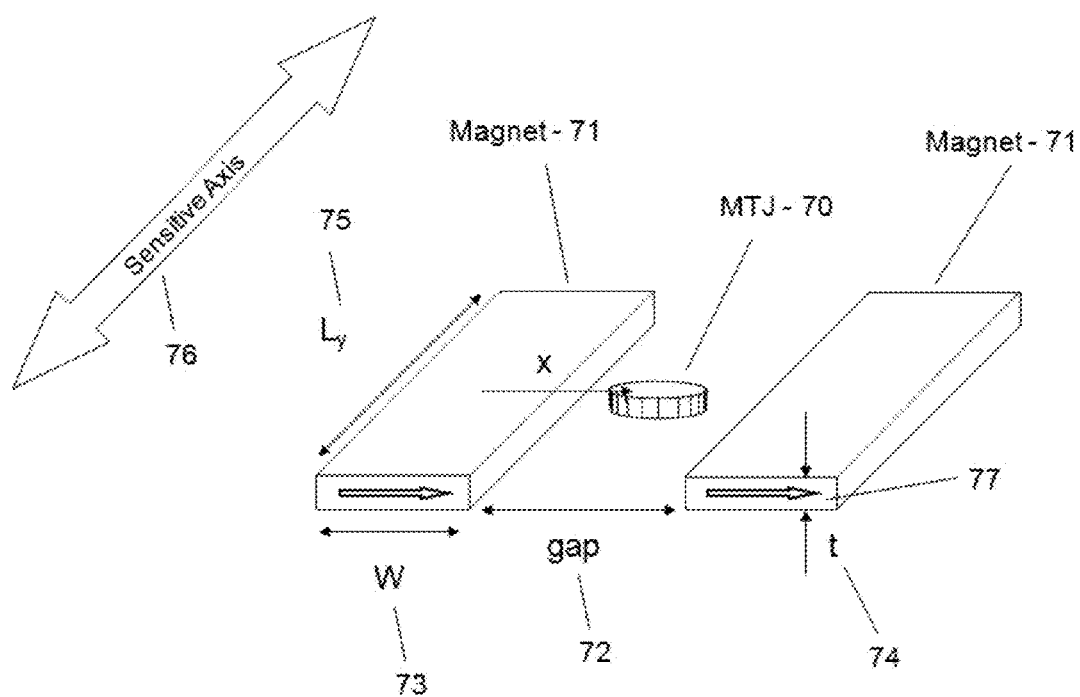
FIG. 7—A drawing illustrating the location of permanent magnets with respect to MTJ sensor elements.
Figure 8:
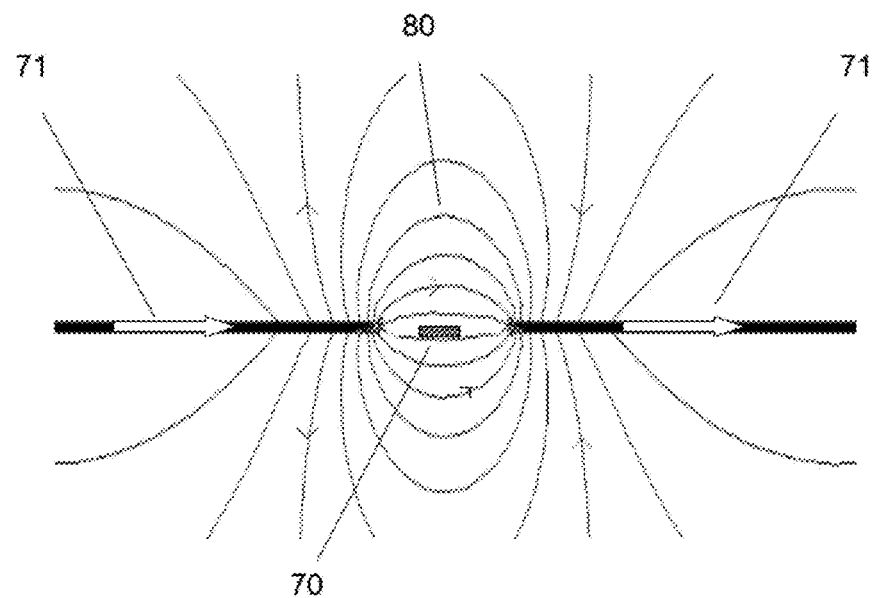
FIG. 8—A cross-section through the permanent magnets and MTJ element shown in FIG. 7, illustrating the pattern of magnetic field lines around a pair of permanent magnetic plates.

A preferred method for providing $H_{cross}$ is illustrated in FIG. 7. Here, a magnetoresistive sensor 70 is situated between two magnets 71. The magnets are separated by a "gap" 72; have width "W" 73, thickness "t" 74, and length "$L_y$" 75. The magnets are designed to provide a cross-bias field in the direction perpendicular to the sensitive axis 76 of the bridge sensor. The permanent magnets are initialized using a large magnetic field, such that their magnetization 77 is nominally perpendicular to the sensing axis 76 of the bridge sensor. The resulting pattern of magnetic field lines around the magnets 71 is shown at 80 in FIG. 8.

Figure 9:
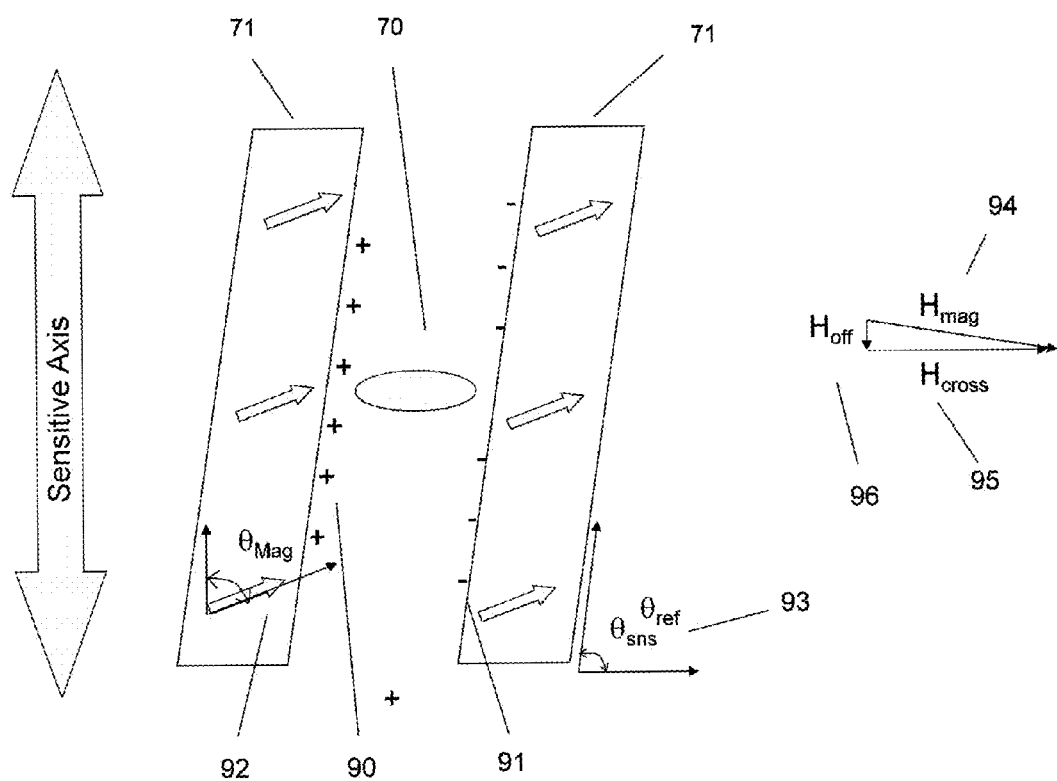
FIG. 9—a drawing illustrating the various angles associated with setting the field strength and orientation at the MTJ element in order to control offset and saturation fields of the MTJ transfer curves.

The field from the permanent magnets can be considered to be due to virtual magnetic charges that form at the edge of the permanent magnet plates as illustrated in FIGS. 9 at 90 and 91 as a result of boundary conditions on the magnetization. The charges vary with magnitude and orientation "$q_{mag}$" 92 of the remanent magnetization "$M_r$" with respect to the orientation of the edge of the permanent magnet slab "$q_r$" or "$q_{sns}$" 93 as:

$$\rho_s = M_r \cos(\theta_{Mag} + \theta_{ref}) \text{ or } \rho_s = M_r \cos(\theta_{Mag} + \theta_{sns}) \quad (14)$$

These virtual charges produce a magnetic field according to $$\vec{H}(\vec{r}) = 4\pi \int_{Surface} \frac{\rho_s}{(\vec{r} - \vec{r}')^2} dS' \quad (15)$$

In the case where $q_{mag} = q_{ref}$ or $q_{ref} = \pi/2$, the magnetic field at the center of the MTJ as a function of the remanent magnetization, $M_r$ is given as $$H_{cross} = -8M_r\left(\operatorname{atan}\left(\frac{L_y t}{\left(\frac{W}{2} - \frac{gap}{2}\right)\sqrt{L_y^2 t^2 \left(\frac{W}{2} - \frac{gap}{2}\right)^2}}\right) + \operatorname{atan}\left(\frac{L_y t}{\left(\frac{W}{2} + \frac{gap}{2}\right)\sqrt{L_y^2 t^2 \left(\frac{W}{2} + \frac{gap}{2}\right)^2}}\right)\right) \quad (16)$$

Figure 10:
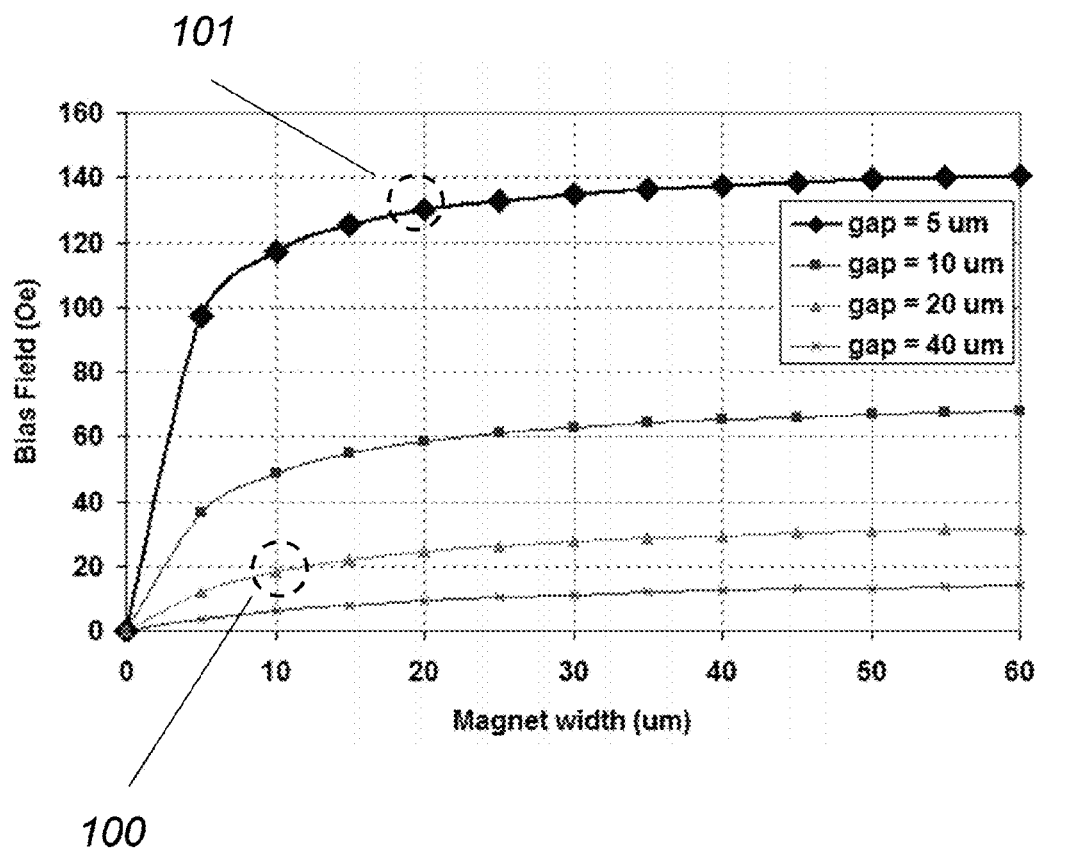
FIG. 10—Magnetic field strength at the center of a pair of permanent magnet plates as a function of magnet width and magnet-to-magnet gap.

Equation 16 is plotted in FIG. 10 as a function of W 73 and gap 72 to show how the saturation field of the reference and sensor arms can be varied with respect to each other by changing the dimensions of the permanent magnet structures 71. Here for example, using the same MTJ stack, MTJ element dimensions, and permanent magnet film in the sensor and reference arms, it is possible to get a factor of 6.5× difference in $H_{cross}$ 100 and 101, so that the reference leg saturates at a field 6.5× higher than the sensor leg. This is sufficient for a referenced bridge, and it is relatively easy to get differences exceeding a factor of 10 with proper design.

FIG. 9 also shows that it is possible to use the orientation of the magnets with respect to the sensing direction to produce both $H_{cross}$ 95 and an offset field, $H_{off}$ 96, in order to both set the saturation value of the MTJ element in addition to offsetting the transfer curve of the MTJ element in order to optimize the bridge response for symmetry, offset, and sensitivity. Additionally, the ability to set $M_r$ at an angle 92 with respect to the sensing direction, after the device is fabricated, provides the ability to fine tune the device after manufacturing in order to minimize offset or ASYM. This capability can be used to increase manufacturing yield.

Figure 11:
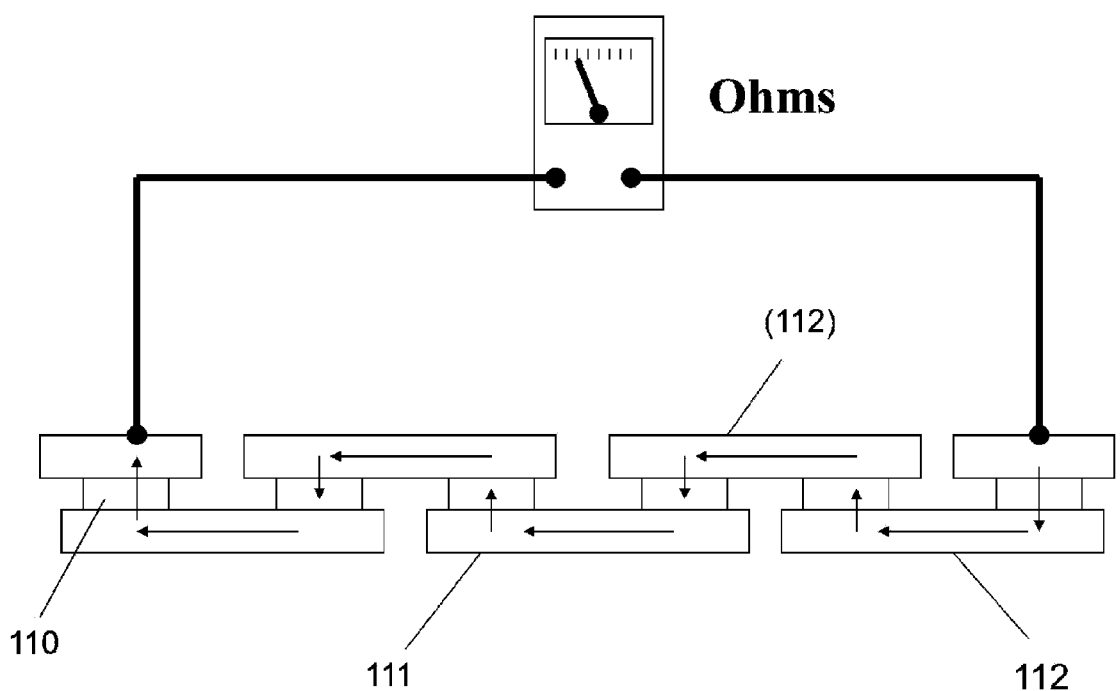
FIG. 11—A schematic drawing showing method for combining a plurality of MTJ elements into a single magnetoresistive element.

Because of their small size, MTJ elements can be connected together in a string in order to increase sensitivity, reduce 1/F noise, and improve resistance to electrostatic discharge as shown in FIG. 11. The MTJ elements 110 are sandwiched between bottom 111 and top 112 electrodes, and interconnected such that the current 113 flows vertically through the MTJ 110 through alternating conductors patterned from the top and bottom conducting layers. It is advantageous to keep the same size MTJ junctions in the reference and sensor arms of the bridge, because it makes the device less sensitive to etch bias during fabrication, so a further advantage of these strings of MTJ elements is the number of elements in each string can be varied in order to set the optimal resistance ratio between the reference and sensor arms of the bridge.

Figure 12:
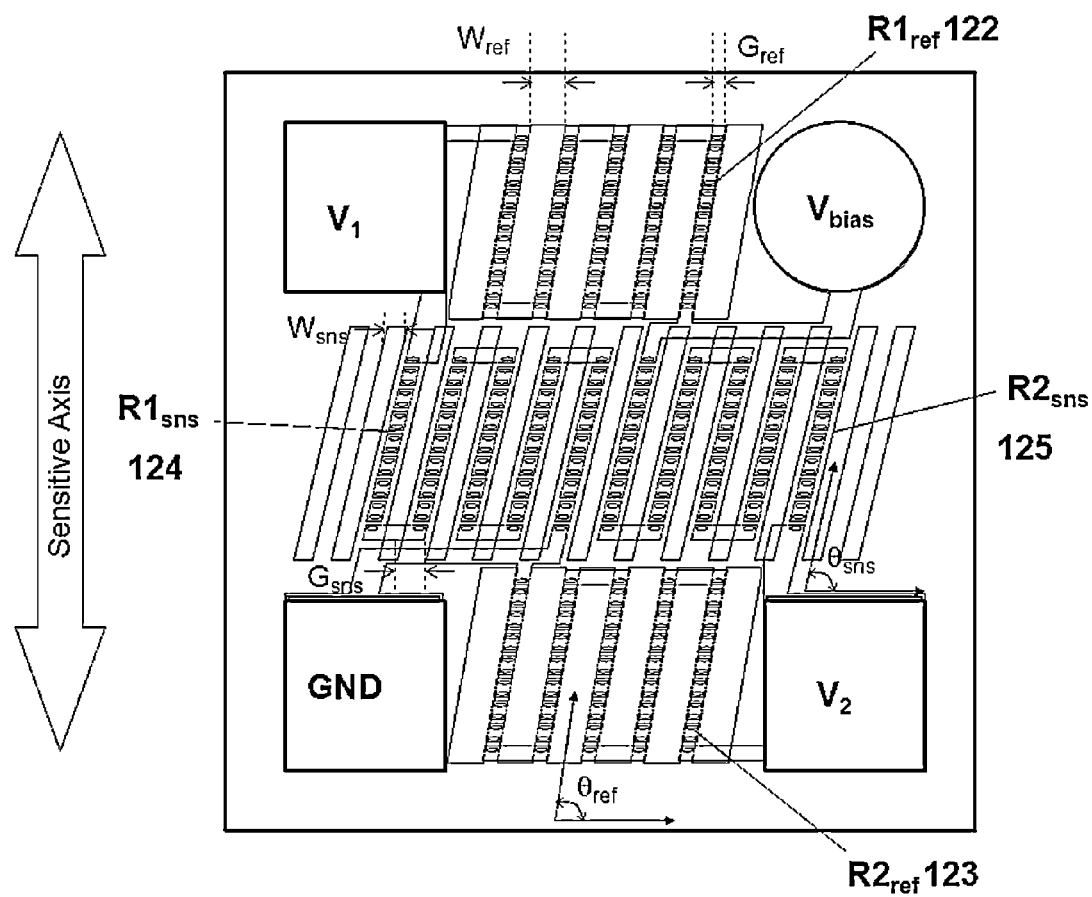
FIG. 12—An exemplary sensor die layout utilizing tilted magnets in order to set reference and sensor arm bias points to optimize the bridge transfer curve.

FIG. 12 shows an exemplary die layout using tilted permanent magnets of different widths and spacing in the reference and sensor arms to produce an optimal referenced full bridge sensor. In this design, strings of MTJ elements are situated between permanent magnet slabs that are tilted at different angles in the reference 122, 123 and sensor 124, 125 arm areas of the bridge optimization may be accomplished by zeroing the offset of both the reference and sensor arms and adjusting the relative number of MTJ elements in the reference and sensor MTJ strings, or by offsetting only the reference or sensor strings.

Because the reference arm sense arm are composed of a number of magnetoresistance elements electrically connected in series, the number of elements in each arm determines the resistance of the arm, such that if the number of magnetoresistive elements in the reference arms or the sensor arms is varied, the offset can varied. Because the number of magnetoresistive elements in the reference arm can be used to adjust of the reference arm resistance, and the number of magnetoresistive elements in the sense arm controls the sense arm resistance, the ratio of the number of elements in the reference arm and the sensor arms determines the resistance ratio.

It can be shown from equation (4) that the bridge response can be centered and made relatively symmetric by setting the offset of the sensor arm with respect to the reference arm as follows:

$$H_o^{sns} = \left(\frac{H_s^{sns}}{H_s^{ref}}\right)H_o^{ref} \qquad (17)$$

This can be accomplished by setting $q_{ref}$ at $\pi/2$, and $q_{sns}$ in the range between $\pi/4$ to $\pi/2$.

Figure 13:
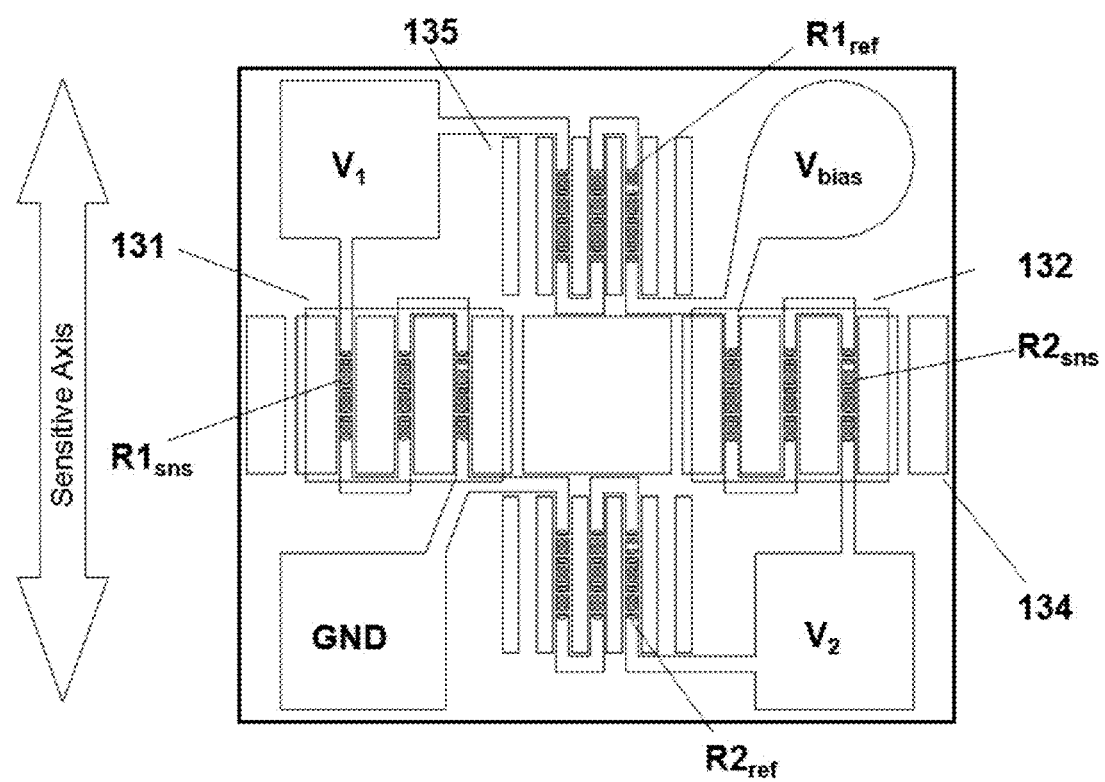
FIG. 13—An exemplary die layout using permanent magnet bias and 0 degree rotated MTJ elements in the sensor arms. Shields are placed over the reference arms to increase the bridge sensitivity.

FIG. 13 shows another implementation of the referenced full bridge sensor design that uses shields 131, 132 in combination with varied permanent magnet biasing 134, 135 to set the different saturation fields of the reference and sensor arms. The shields combined with width narrowly spaced magnets in the reference arm, reduce the sensitivity of the reference arm by about a factor of 10 beyond what can be accomplished using shields or permanent magnet biasing alone. The difference in sensitivity of the reference and sensor arms can be further increased by adding other forms of biasing, such as exchange coupling or by using shape anisotropy. There is great flexibility to tune the design using the techniques described in the section.

Figure 14:
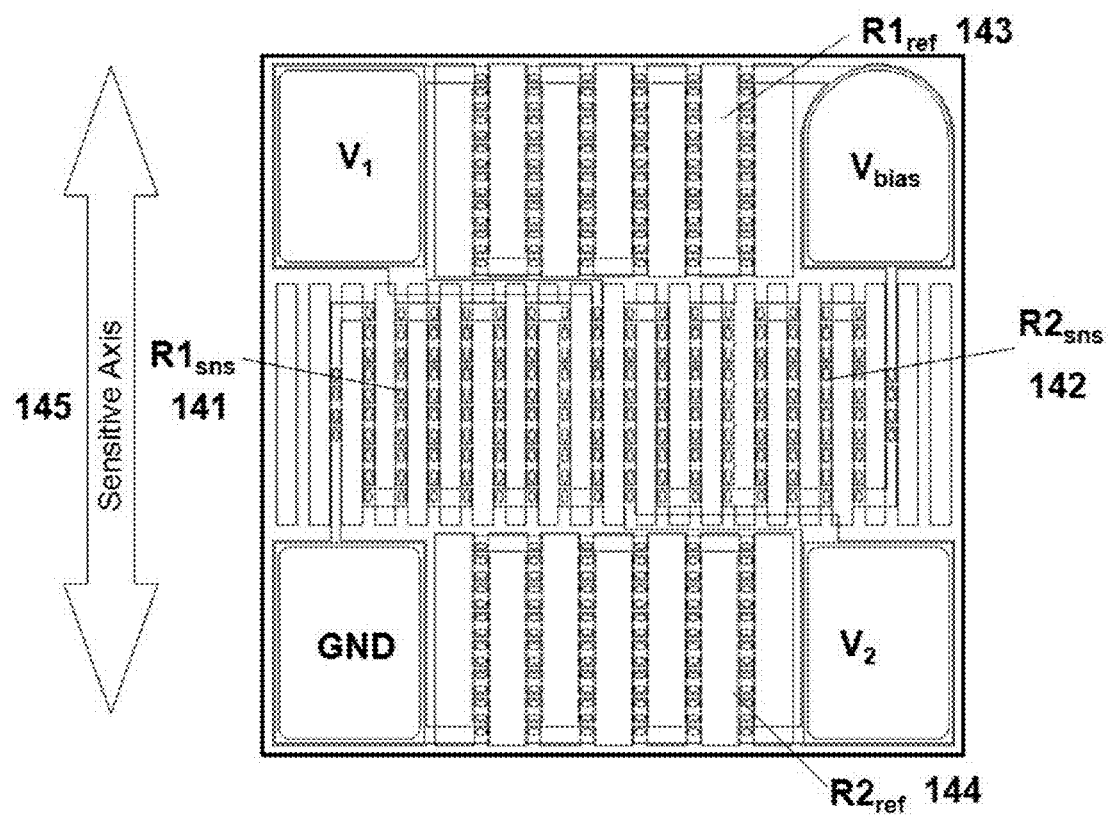
FIG. 14—An exemplary die layout using permanent magnet bias and 90 degree rotated MTJ elements in the sensor arms FIG. 15—A plot showing the cross-axis bias filed required to set the saturation field for a 90 degree rotated sensor element.

FIG. 14 shows a die layout for another possible modification of the design that can be used to build high sensitivity sensors, by exploiting the competition between shape anisotropy and bias field to produce a low $H_s^{sns}$. Here, the sensor MTJ elements 141, 142 are rotated at 90 degrees with respect to the reference elements 143, 144. The magnets in the sensor arm area are designed to saturate the sensor MTJ elements in a direction perpendicular to the sensing axis. Fields applied along the sensing axis 145 thus tilt the magnetization of the sensor element proportionally towards the sensing axis 145.

Figure 15:
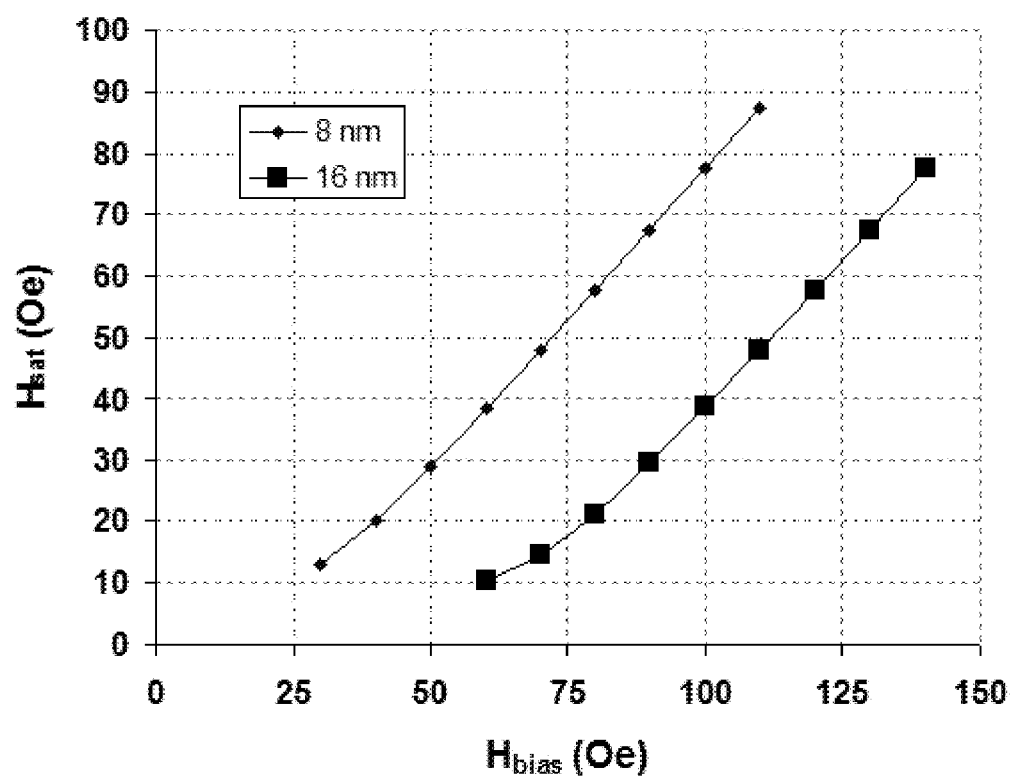

FIG. 15 shows the saturation field measured along the long axis of 6 mm by 2 mm elliptical MTJ elements that have a cross bias applied along their short axis. The two curves 151 and 152 are plotted for a 8 nm and 16 nm free layer thicknesses. With proper design, it is possible to produce a linear sensor with very high sensitivity over a narrow field range. This type of design is useful for applications such as an e-compass.

In the present invention, a first embodiment provides a single-chip referenced full-bridge magnetic field sensor comprising two reference arms and the two sensing arms that are spatially interleaved and electrically interconnected to form a Wheatstone bridge, wherein each reference arm includes one or more MTJ or GMR magnetoresistive reference elements, and each sensing arm includes one or more MTJ or GMR magnetoresistive sensing elements, said sensing elements utilize the portion of the transfer curve that is linearly dependent on the applied magnetic field: the magnetic field sensor further comprises a set of permanent magnets located in the vicinity of the sensing and reference elements, wherein the orientation of the permanent magnet structures and the permanent magnet magnetization is used to adjust the response of the sensor chip, and a set of bond pads used to electrically connect said referenced full-bridge sensor chip to an ASIC or to the lead frame of a semiconductor package.

Preferably the reference arms and sensing arms are fabricated simultaneously utilizing the same fabrication process steps in order to enhance the temperature stability and the uniformity of said referenced full-bridge magnetic field sensor chip. The resistance of each reference arm is adjustable by varying the number of MTJ or GMR magnetoresistive reference elements, and the resistance of each sensing arm is adjustable by varying the number of the MTJ or GMR magnetoresistive sensing elements such that the resistance ratio between the sensing and reference arms can be set to adjust the sensor performance; the magnetic field sensor further comprises a magnetic shield composed of a high permeability ferromagnetic material covering the reference elements, and its purpose is to reduce the magnetic field of the reference arms thereby increase the sensitivity of the sensor bridge. The referenced full-bridge magnetic field sensor chip further comprises a high-permeability ferromagnetic material in the vicinity of the MTJ or GMR magnetoresistive sensing elements in order to increase the magnetic field at the location of the sensing elements, and thereby increasing the magnetic field sensitivity of the sensor.

In the second embodiment of the present invention the single-chip referenced full-bridge magnetic field sensor comprises two reference arms and the two sensing arms that are spatially interleaved and electrically interconnected to form a Wheatstone bridge, wherein each reference arm includes one or more MTJ or GMR magnetoresistive reference elements, and each sensing arm includes one or more MTJ or GMR magnetoresistive sensing elements, said sensing elements utilize the portion of the transfer curve that is linearly dependent on the applied magnetic field; wherein the MTJ or GMR magnetoresistive reference elements are thinner and longer than the MTJ or GMR magnetoresistive sensing elements; and a set of bond pads used to electrically connect said referenced full-bridge sensor chip to an ASIC or to the lead frame of a semiconductor package.

Preferably, the reference arms and sensing arms are fabricated simultaneously utilizing the same fabrication process steps in order to enhance the temperature stability and the uniformity of said referenced full-bridge magnetic field sensor chip. The resistance of each reference arm is adjustable by varying the number of MTJ or GMR magnetoresistive reference elements, and the resistance of each sensing arm is adjustable by varying the number of the MTJ or GMR magnetoresistive sensing elements such that the resistance ratio between the sensing and reference arms can be set to adjust the sensor performance; The reference arm is covered by a magnetic shield composed of a high permeability ferromagnetic material, and its purpose is to reduce the magnetic field in the vicinity of the reference element thereby increasing the sensitivity of the bridge sensor. The magnetic field sensor further comprises a high permeability ferromagnetic material in the vicinity of the MTJ or GMR magnetoresistive sensing elements in order to increase the magnetic field at the location of the sensing elements, further increasing the sensitivity of the magnetic field sensor.

A third possible implementation of the present invention is a single-chip referenced full-bridge magnetic field sensor comprising two reference arms and the two sensing arms that are spatially interleaved and electrically interconnected to form a Wheatstone bridge, wherein each reference arm includes one or more MTJ or GMR magnetoresistive reference elements, and each sensing arm includes one or more MTJ or GMR magnetoresistive sensing elements, said sensing elements utilize the portion of the transfer curve that is linearly dependent on the applied magnetic field; wherein the reference arm is covered by a magnetic shield composed of a high permeability ferromagnetic material; and a set of bond pads used to electrically connect said referenced full-bridge sensor chip to an ASIC or to the lead frame of a semiconductor package.

Preferably, The resistance of each reference arm is adjustable by varying the number of MTJ or GMR magnetoresistive reference elements, and the resistance of each sensing arm is adjustable by varying the number of the MTJ or GMR magnetoresistive sensing elements such that the resistance ratio between the sensing and reference arms can be set to adjust the sensor performance; The magnetic field sensor further comprises a high permeability ferromagnetic material in the vicinity of the MTJ or GMR magnetoresistive sensing elements in order to increase the magnetic field at the location of the sensing elements, thereby increasing the magnetic field sensitivity of the sensor.

A fourth possible implementation of the present invention is a single-chip referenced full-bridge magnetic field sensor comprises two reference arms and the two sensing arms that are spatially interleaved and electrically interconnected to form a Wheatstone bridge, wherein each reference arm includes one or more MTJ or GMR magnetoresistive reference elements, and each sensing arm includes one or more MTJ or GMR magnetoresistive sensing elements, said sensing elements utilize the portion of the transfer curve that is linearly dependent on the applied magnetic field; an antiferromagnetic layer or a permanent magnet layer deposited above or below a free layer of the reference arms, wherein an exchange coupling from the antiferromagnetic layer or stray field coupling from the permanent magnet layer is used to magnetically bias the reference arm; and a set of bond pads used to electrically connect said referenced full-bridge sensor chip to an ASIC or to the lead frame of a semiconductor package.

Preferably, the MTJ or GMR magnetoresistive reference elements are thinner and longer than the MTJ or GMR magnetoresistive sensing elements. The reference arm is covered by a magnetic shield composed of a high permeability ferromagnetic material, and its purpose is to reduce the magnetic field in the vicinity of the reference element thereby increasing the sensitivity of the bridge sensor. The magnetic field sensor further comprises a high permeability ferromagnetic material in the vicinity of the MTJ or GMR magnetoresistive sensing elements in order to increase the magnetic field at the location of the sensing elements, further increasing the sensitivity of the magnetic field sensor.

A fifth possible implementation of the present invention is a single-chip referenced full-bridge magnetic field sensor comprises two reference arms and the two sensing arms that are spatially interleaved and electrically interconnected to form a Wheatstone bridge, wherein each reference arm includes one or more MTJ or GMR magnetoresistive reference elements, and each sensing arm includes one or more MTJ or GMR magnetoresistive sensing elements, said sensing elements utilize the portion of the transfer curve that is linearly dependent on the applied magnetic field; an antiferromagnetic layer or a permanent magnet layer deposited above or below a free layer of the reference arms, wherein an exchange coupling from the antiferromagnetic layer or stray field coupling from the permanent magnet layer is used to magnetically bias the reference arm; the MTJ or GMR magnetoresistive reference elements are thinner and longer than the MTJ or GMR magnetoresistive sensing elements; and a set of bond pads used to electrically connect said referenced full-bridge sensor chip to an ASIC or to the lead frame of a semiconductor package.

Preferably, the magnetic field sensor further comprises a reference arm that is covered by a magnetic shield composed of a high permeability ferromagnetic material, and its purpose is to reduce the magnetic field in the vicinity of the reference element thereby increasing the sensitivity of the bridge sensor. The magnetic field sensor further comprises a high permeability ferromagnetic material in the vicinity of the MTJ or GMR magnetoresistive sensing elements in order to increase the magnetic field at the location of the sensing elements, further increasing the sensitivity of the magnetic field sensor.

A sixth possible implementation of the present invention is a single-chip referenced full-bridge magnetic field sensor comprises two reference arms and the two sensing arms that are spatially interleaved and electrically interconnected to form a Wheatstone bridge, wherein each reference arm includes one or more MTJ or GMR magnetoresistive reference elements, and each sensing arm includes one or more MTJ or GMR magnetoresistive sensing elements, said sensing elements utilize the portion of the transfer curve that is linearly dependent on the applied magnetic field; an antiferromagnetic layer or a permanent magnet layer deposited above or below a free layer of the reference arms, wherein an exchange coupling from the antiferromagnetic layer or stray field coupling from the permanent magnet layer is used to magnetically bias the reference arm; wherein the reference arm is covered by a magnetic shield composed of a high permeability ferromagnetic material; and a set of bond pads used to electrically connect said referenced full-bridge sensor chip to an ASIC or to the lead frame of a semiconductor package.

Preferably, the magnetic field sensor further comprises a high permeability ferromagnetic material in the vicinity of the MTJ or GMR magnetoresistive sensing elements in order to increase the magnetic field at the location of the sensing elements, further increasing the sensitivity of the magnetic field sensor.

It will be apparent to those skilled in the art that various modifications can be made to the proposed invention without departing from the scope or spirit of the invention. Further, it is intended that the present invention cover modifications and variations of the present invention provided that such modifications and variations come within the scope of the appended claims and their equivalence.

The invention claimed is:

1. A referenced full-bridge magnetic field sensor chip comprising two reference arms and two sensing arms that are spatially interleaved and electrically interconnected to form a Wheatstone bridge, wherein each reference arm includes one or more MTJ or GMR magnetoresistive reference elements, and each sensing arm includes one or more MTJ or GMR magnetoresistive sensing elements, said sensing elements utilize the portion of a transfer curve that is linearly dependent on an applied magnetic field; said reference arm sensitivity is less than said sensor arm sensitivity wherein a relative resistance of the sensing and reference arms is adjusted by varying the number of the MTJ or GMR magnetoresistive sensing elements; wherein the reference arms and sensing arms are fabricated simultaneously utilizing the same fabrication process steps in order to enhance the temperature stability and the uniformity of said referenced full-bridge magnetic field sensor chip; and a set of bond pads used to electrically connect said referenced full-bridge sensor chip to an ASIC or to the lead frame of a semiconductor package.

2. The referenced full-bridge magnetic field sensor chip of claim 1, wherein the MTJ or GMR magnetoresistive reference elements are thinner and longer than the MTJ or GMR magnetoresistive sensing elements.

3. The referenced full-bridge magnetic field sensor chip of claims 1 wherein the reference arm is covered by a magnetic shield composed of a high permeability ferromagnetic material, in order to decrease the magnetic field at the location of the reference elements.

4. The referenced full-bridge magnetic field sensor chip of claim 3, further comprising a high permeability ferromagnetic material in the vicinity of the MTJ or GMR magnetoresistive sensing elements in order to increase the applied magnetic field at the location of the sensing elements.

5. The referenced full-bridge magnetic field sensor chip of claims 3, wherein the MTJ or GMR magnetoresistive reference elements are thinner and longer than the MTJ or GMR magnetoresistive sensing elements.

6. The referenced full-bridge magnetic field sensor chip of claims 4, wherein the MTJ or GMR magnetoresistive reference elements are thinner and longer than the MTJ or GMR magnetoresistive sensing elements.

7. The referenced full-bridge magnetic field sensor chip of claims 1, wherein an antiferromagnetic layer or a permanent magnet layer deposited above or below a free layer of the reference arms, wherein an exchange coupling from the antiferromagnetic layer or stray field coupling from the permanent magnet layer is used to magnetically bias the reference arm.

8. The referenced full-bridge magnetic field sensor chip of claims 2, wherein an antiferromagnetic layer or a permanent magnet layer deposited above or below a free layer of the reference arms, wherein an exchange coupling from the antiferromagnetic layer or stray field coupling from the permanent magnet layer is used to magnetically bias the reference arm.

9. The referenced full-bridge magnetic field sensor chip of claims 3, wherein an antiferromagnetic layer or a permanent magnet layer deposited above or below a free layer of the reference arms, wherein an exchange coupling from the antiferromagnetic layer or stray field coupling from the permanent magnet layer is used to magnetically bias the reference arm.

10. The referenced full-bridge magnetic field sensor chip of claims 4, wherein an antiferromagnetic layer or a permanent magnet layer deposited above or below a free layer of the reference arms, wherein an exchange coupling from the antiferromagnetic layer or stray field coupling from the permanent magnet layer is used to magnetically bias the reference arm.

11. The referenced full-bridge magnetic field sensor chip of claims 1, wherein a set of permanent magnets located in the vicinity of the sensing and reference elements, wherein the orientation of the set of permanent magnets and the permanent magnet magnetization is used to adjust the response of the sensor chip.

12. The referenced full-bridge magnetic field sensor chip of claims 2, wherein a set of permanent magnets located in the vicinity of the sensing and reference elements, wherein the orientation of the set of permanent magnets and the permanent magnet magnetization is used to adjust the response of the sensor chip.

13. The referenced full-bridge magnetic field sensor chip of claims 3, wherein a set of permanent magnets located in the vicinity of the sensing and reference elements, wherein the orientation of the set of permanent magnets and the permanent magnet magnetization is used to adjust the response of the sensor chip.

14. The referenced full-bridge magnetic field sensor chip of claims 4, wherein a set of permanent magnets located in the vicinity of the sensing and reference elements, wherein the orientation of the set of permanent magnets and the permanent magnet magnetization is used to adjust the response of the sensor chip.

15. The referenced full-bridge magnetic field sensor chip of claim 12, wherein the spacing between the permanent magnets surrounding the reference arms is smaller than the spacing between the permanent magnets surrounding the sense arms.

16. The referenced full-bridge magnetic field sensor chip of claims 12, wherein the width of the permanent magnets surrounding the reference arms is greater than the width of the permanent magnets surrounding the sense arms.

17. The referenced full-bridge magnetic field sensor chip of claims 15, wherein the width of the permanent magnets surrounding the reference arms is greater than the width of the permanent magnets surrounding the sense arms.

18. The referenced full-bridge magnetic field sensor chip of claims 1, wherein an antiferromagnetic layer or a permanent magnet layer deposited above or below a free layer of the reference and sense arms, wherein an exchange coupling from the antiferromagnetic layer or stray field coupling from the permanent magnet layer is used to magnetically bias the reference and sensing arms.

19. The referenced full-bridge magnetic field sensor chip of claims 2, wherein an antiferromagnetic layer or a permanent magnet layer deposited above or below a free layer of the reference and sense arms, wherein an exchange coupling from the antiferromagnetic layer or stray field coupling from the permanent magnet layer is used to magnetically bias the reference and sensing arms.

20. The referenced full-bridge magnetic field sensor chip of claims 3, wherein an antiferromagnetic layer or a permanent magnet layer deposited above or below a free layer of the reference and sense arms, wherein an exchange coupling from the antiferromagnetic layer or stray field coupling from the permanent magnet layer is used to magnetically bias the reference and sensing arms.

21. The referenced full-bridge magnetic field sensor chip of claims 4, wherein an antiferromagnetic layer or a permanent magnet layer deposited above or below a free layer of the reference and sense arms, wherein an exchange coupling from the antiferromagnetic layer or stray field coupling from the permanent magnet layer is used to magnetically bias the reference and sensing arms.

\* \* \* \* \*